United States Patent
Inoue et al.

(10) Patent No.: US 8,815,652 B2
(45) Date of Patent: Aug. 26, 2014

(54) SEMICONDUCTOR DEVICE AND METHOD OF MANUFACTURING THE SAME AND SEMICONDUCTOR MANUFACTURING DEVICE

(75) Inventors: Fumihiko Inoue, Aizuwakamatsu (JP); Kentaro Sera, Aizumisato-machi (JP)

(73) Assignee: Spansion LLC, Sunnyvale, CA (US)

( * ) Notice: Subject to any disclaimer, the term of this patent is extended or adjusted under 35 U.S.C. 154(b) by 611 days.

(21) Appl. No.: 12/130,577

(22) Filed: May 30, 2008

(65) Prior Publication Data

US 2008/0316790 A1 Dec. 25, 2008

(30) Foreign Application Priority Data

Jun. 7, 2007 (JP) .................................. 2007-151619

(51) Int. Cl.
*H01L 21/82* (2006.01)
*H01L 27/112* (2006.01)
*G11C 17/10* (2006.01)

(52) U.S. Cl.
CPC .............. *G11C 17/10* (2013.01); *H01L 27/112* (2013.01); *H01L 27/11226* (2013.01)
USPC .................................. 438/128; 257/E21.602

(58) Field of Classification Search
USPC ................................... 257/E21.602; 438/128
See application file for complete search history.

(56) References Cited

U.S. PATENT DOCUMENTS

2001/0044177 A1* 11/2001 Fukushima et al. .......... 438/226
2005/0133790 A1* 6/2005 Kato ............................... 257/66

FOREIGN PATENT DOCUMENTS

| JP | 2003520451 A | 7/2003 |
| JP | 2006236511 A | 9/2006 |
| JP | 2007059948 A | 3/2007 |

* cited by examiner

*Primary Examiner* — Matthew Reames

(57) ABSTRACT

The present invention is a manufacturing method for a semiconductor device having steps of; aligning a program head 80 having a program dot array corresponding to each OTP-ROM cell array 21 provided in areas 12 to be a plurality of semiconductor chips arranged in a semiconductor wafer to the OTP-ROM cell array 21 in one of the areas to be the plurality of semiconductor chips 12; and programming the OTP-ROM cell array 21 with a different pattern for each of the areas to be the plurality of semiconductor chips 12 by using the program head 80.

7 Claims, 14 Drawing Sheets

SEMICONDUCTOR DEVICE AND METHOD OF MANUFACTURING THE SAME AND SEMICONDUCTOR MANUFACTURING DEVICE

CROSS-REFERENCE TO RELATED APPLICATIONS

The present invention is based on Japanese Patent Application No. 2007-151619 filed on Jun. 7, 2007, the disclosure of which is hereby incorporated by reference.

TECHNICAL FIELD

The present invention relates to a semiconductor device and a method of manufacturing the same and a semiconductor manufacturing device, and more particularly to a semiconductor device having an OTP-ROM cell and a method of manufacturing the same and a semiconductor manufacturing device.

BACKGROUND OF THE INVENTION

A one-time-programmable (OTP) read-only-memory (ROM) is a ROM which stores data by irreversibly deforming a part of a ROM cell. Therefore, once data is stored, it cannot be erased. As a method for programming an OTP-ROM in a semiconductor chip, a technology to program the OTP-ROM using an ink-jet printing method and a laser cutting method is disclosed in Japanese Patent Application Publication No. JP-A-2005-203763

SUMMARY OF THE INVENTION

In order to solve the problems described above, it is an object of the present invention to make a security level of programmed information high and to make programming each semiconductor chip with different information easy.

According to the present invention, a method for manufacturing a semiconductor device includes steps of: aligning a program head having a program dot array corresponding to each OTP-ROM cell array provided in areas to be a plurality of semiconductor chips arranged in a semiconductor wafer to the OTP-ROM cell array in one of the areas to be the plurality of semiconductor chips; and programming the OTP-ROM cell array with a different pattern for each of the areas to be the plurality of semiconductor chips by using the program head. According to the present invention, since information is stored in the OTP-ROM cell, it is possible to make a security level of programmed information high. Further, the program dot array of the program head corresponds to the OTP-ROM cell array. The program head is aligned to the OTP-ROM cell array of each semiconductor chip and programs the OTP-ROM cell array with a different pattern for each semiconductor chip. Consequently, the OTP-ROM cell array in the areas to be the plurality of semiconductor chips can be easily programmed with a different pattern for each semiconductor chip.

According to the structure mentioned above, the step of programming the OTP-ROM cell array may be structured to eject a chemical fluid that activates or inactivates a plurality of OTP-ROM cells included in the OTP-ROM cell array to the plurality of OTP-ROM cells.

According to the structure mentioned above, the step of programming the OTP-ROM cell array may be structured to activate or inactivate the plurality of OTP-ROM cells by connecting a wiring of the OTP-ROM cell array by using the chemical fluid.

According to the structure mentioned above, the step of programming the OTP-ROM cell array may be structured to activate or inactivate the plurality of OTP-ROM cells by disconnecting a wiring of the OTP-ROM cell array by using the chemical fluid.

According to the structure mentioned above, the step of programming the OTP-ROM cell array may include: forming a pattern to activate or inactivate a plurality of OTP-ROM cells by irradiating a photoresist on the OTP-ROM cell array with light by using the program head; and activating or inactivating the plurality of OTP-ROM cells by connecting or disconnecting a wiring of the OTP-ROM cell array by using the pattern.

According to the structure mentioned above, the step of programming the OTP-ROM cell array may include: forming a pattern to activate or inactivate a plurality of OTP-ROM cells by irradiating a photoresist on the OTP-ROM cell array with light by using the program head; and activating or inactivating the plurality of OTP-ROM cells by ion-implanting the plurality of OTP-ROM cells by using the pattern.

A semiconductor manufacturing device according to the invention includes: a program head having a program dot array corresponding to each OTP-ROM cell array provided in areas to be a plurality of semiconductor chips arranged in a semiconductor wafer; and an aligning portion for aligning the program head to the OTP-ROM cell array in one of the areas to be the plurality of semiconductor chips; in which the program head programs the OTP-ROM cell array with a different pattern for each of the areas to be the plurality of semiconductor chips. Accordingly, the OTP-ROM cell array in the areas to be the plurality of semiconductor chips can be easily programmed with a different pattern for each semiconductor chip.

A semiconductor device according to the invention includes: an OTP-ROM cell array having a plurality of OTP-ROM cells stored with identification information peculiar to the semiconductor device; in which the plurality of OTP-ROM cells are activated or inactivated according to the identification information. Accordingly, since the identification information is stored in the OTP-ROM cell, it is possible to make a security level of the identification information high. It is also possible to provide a semiconductor device that can easily produce different identification information for each semiconductor chip.

According to the structure mentioned above, the plurality of OTP-ROM cells may be activated or inactivated by connecting or disconnecting a wiring for each of the plurality of OTP-ROM cells.

According to the structure mentioned above, the plurality of OTP-ROM cells may be activated or inactivated by presence or absence of different impurities injected in a semiconductor layer for each of the plurality of OTP-ROM cells.

According to the present invention, the program dot array of the program head corresponds to the OTP-ROM cell array. The program head is aligned to the OTP-ROM cell array of each semiconductor chip and programs the OTP-ROM cell array with a different pattern for each semiconductor chip. Consequently, the OTP-ROM cell array in the area to be a plurality of semiconductor chips can be easily programmed with a different pattern for each semiconductor chip.

DETAILED DESCRIPTION

First, the problems to be solved by the present invention will be explained in detail. In a semiconductor device, in view of security enhancement, there may be cases of storing different identification information to each semiconductor chip of the semiconductor device. In this case, when storing identification information to a ROM that is electrically programmable such as an EPROM and an EEPROM, programming different identification information to each semiconductor chip is relatively easy. However, as the identification information programmed is erasable, it is inadequate from a security point of view. On the other hand, when storing identification information in an OTP-ROM, while there is no possibility of identification information being erased, the procedure of programming different identification information to each semiconductor chip becomes complicated. Embodiments of the present invention to solve the problems mentioned above will be explained below.

First Embodiment

Figure 1:
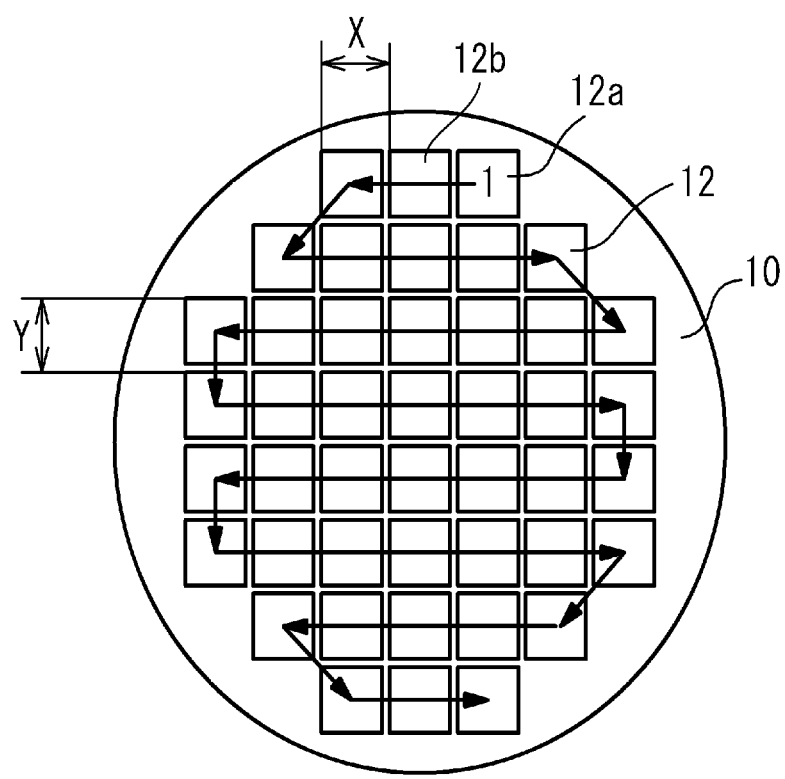
FIG. 1 is a plan view of a semiconductor wafer.

A first embodiment of the present invention is an instance of providing an OTP-ROM in each semiconductor chip and programming the OTP-ROM with identification information of the semiconductor chip. FIG. 1 is a plan view of a semiconductor wafer. In a silicon semiconductor wafer 10, an area 12 to be a semiconductor chip, hereinafter also called as a semiconductor chip 12, is arranged. The semiconductor chip 12 is arranged in a matrix at an interval of X in an X-direction and at an interval of Y in a Y-direction.

Figure 2A:
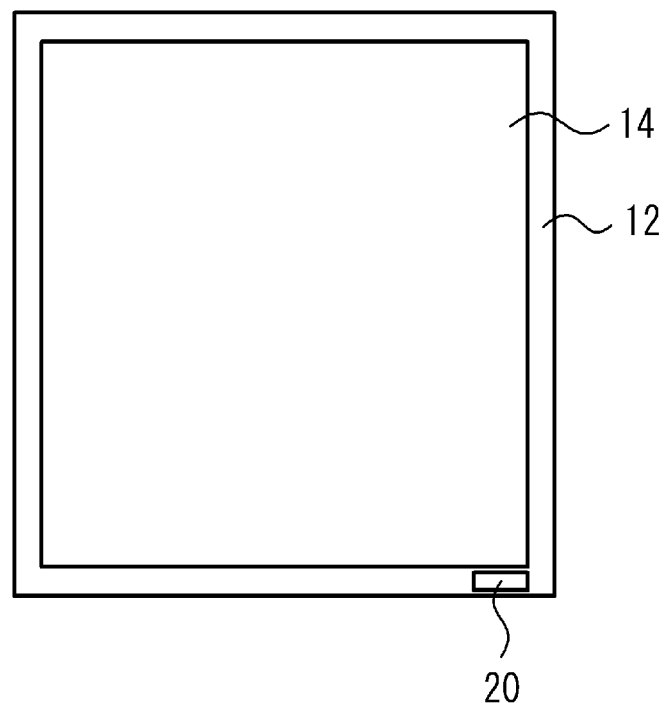
FIG. 2A is a plan view of a semiconductor chip and FIG. 2B is a plan view of a ROM section.
Figure 2B:
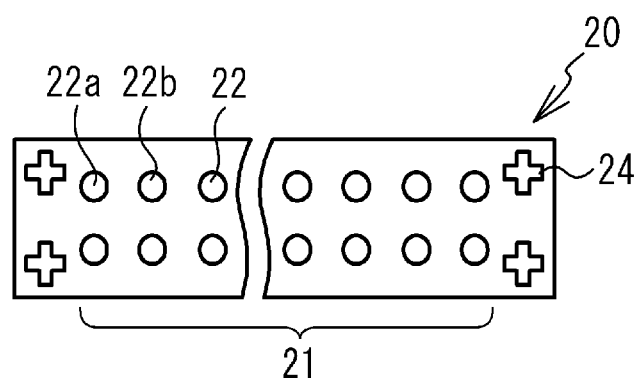

In reference to FIG. 2A, the semiconductor chip 12 has a circuit section 14 and a ROM section 20. The circuit section 14 is composed of memories and logic circuits and performs the main function of the semiconductor chip 12. The ROM section 20 has, as shown in FIG. 2B, a register mark 24 and a plurality of OTP-ROM cells 22, shown by circles in FIG. 2B. A single OTP-ROM cell 22 is programmable with one bit of data. The plurality of OTP-ROM cells is arranged as an OTP-ROM cell array 21 in the ROM section 20. For example, the OTP-ROM cell array 21 may be arranged as an array arrangement of two rows' sixteen cells. When the OTP-ROM cell 22 is arranged in a 10 μm pitch, for example, the ROM section 20 becomes an approximate size of 20' 160 μm. In this case, the OTP-ROM cell array 21 is programmable with 32-bit of data, in the OTP-ROM cell array 21 of the ROM section 20, a different identification number of 232 pieces can be programmed.

Figure 3:
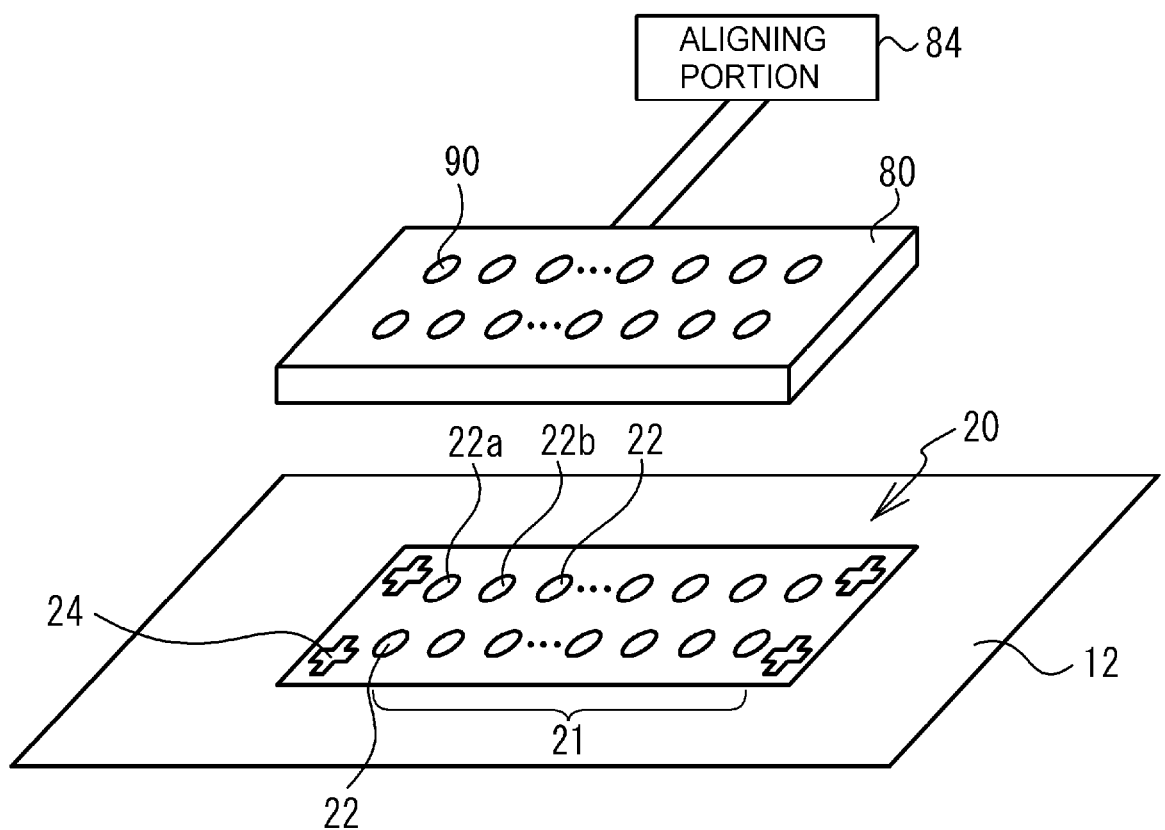
FIG. 3 is a drawing showing the aligning a program head to the ROM section 20.

FIG. 3 is a drawing showing the ROM section 20 provided in the semiconductor chip 12 and a program head 80. The program head 80 has a plurality of program dots 90. The program dot 90 has a function to program a corresponding OTP-ROM cell 22 and is arranged corresponding to an array of the plurality of OTP-ROM cells 22, i.e. an OTP-ROM cell array. The program head 80 is driven by an aligner portion 84 and is aligned to the ROM section 20 of any semiconductor chips 12 in the semiconductor wafer 10.

In reference to FIG. 1, a method for programming the ROM section 20 of each semiconductor chip 12 in the semiconductor wafer 10 with a different identification number for each semiconductor chip will be explained below. First, when programming the plurality of OTP-ROM cells 22 of a single piece of semiconductor chip 12a in the semiconductor wafer 10, in reference to FIG. 3, using the register mark 24, the program head 80 is aligned to an array of the plurality of OTP-ROM cell 22, i.e. an OTP-ROM cell array 21. Using the program head 80, each of the OTP-ROM cells 22 of the OTP-ROM cell array 21 is programmed with a pattern corresponding to an identification number. A method for programming the OTP-ROM cell 22 will be explained later. When programming a value of 1 to the OTP-ROM cell array 21 of the semiconductor chip 12a, for example, an OTP-ROM cell 22a is set as 1 and the other OTP-ROM cells 22 are set as 0.

In reference to FIG. 1, the program head 80 is moved to the ROM section 20 of a semiconductor chip 12b. An array of OTP-ROM cell 22 is programmed with a pattern corresponding to an identification number. When programming a value of 2 to an OTP-ROM cell array 21 of the semiconductor chip 12b, for example, an OTP-ROM cell 22b is set as 1 and the other OTP-ROM cells 22 are set as 0. Thereafter, as indicated by an arrow in FIG. 1, the ROM section 20 of the semiconductor chip 12 is sequentially programmed. As the semiconductor chip 12 is arranged in the same pitch in the semiconductor wafer 10, the program head 80 can be moved, as a stepper, by a constant step of a step of X when moving in the X-direction and a step of Y when moving in the Y-direction. As described above, the plurality of OTP-ROM cells 22 in the OTP-ROM cell array 21 is programmed with a different pattern for each of the plurality of semiconductor chips 12.

As a method for programming the OTP-ROM cell array 21 of the plurality of semiconductor chips 12 in the semiconductor wafer 10 with different patterns, a method using masks in combination is conceivable. However, this method requires a complicated procedure. On the contrary, in accordance with the first embodiment, the program dot 90 of the program head 80 is arranged corresponding to the plurality of OTP-ROM cells 22. The program head 80 is aligned to the OTP-ROM cell array 21 of each semiconductor chip 12, and programs a plurality of OTP-ROM cells 22 of the OTP-ROM cell array 21 with a different pattern for each semiconductor chip 12. Consequently, the OTP-ROM cell array 21 of the plurality of semiconductor chips 12 can be easily programmed with a different pattern for each semiconductor chip 12.

Second Embodiment

Figure 4:
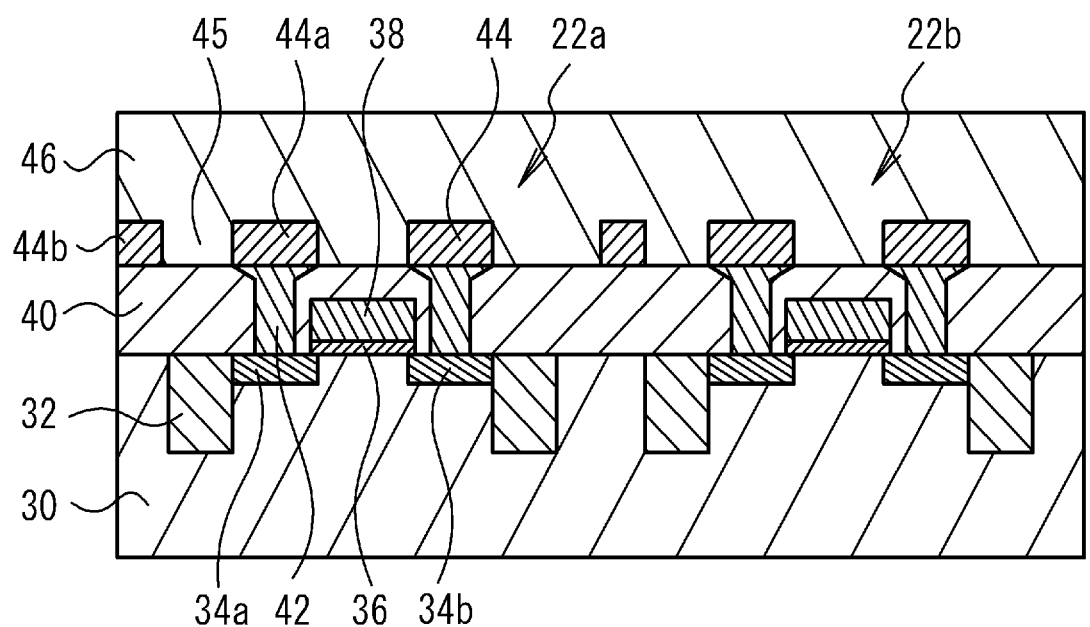
FIG. 4 is a cross sectional view (part 1) of a semiconductor device of a second embodiment of the present invention to illustrate a manufacturing process.
Figure 5:
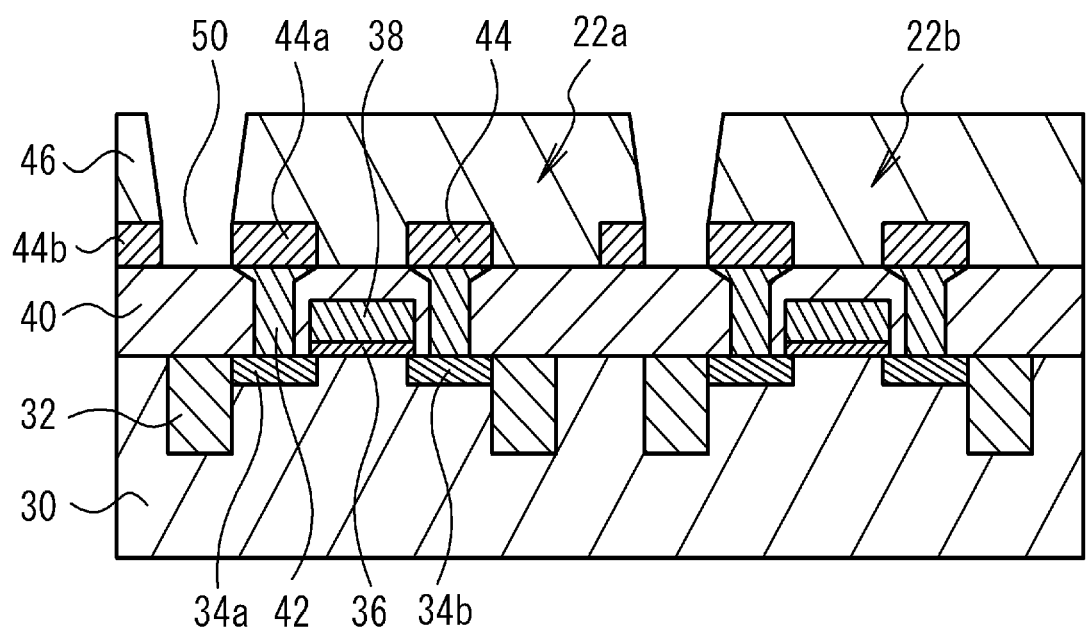
FIG. 5 is a cross sectional view (part 2) of the semiconductor device of the second embodiment to illustrate the manufacturing process.

A second embodiment of the present invention is an example of programming an OTP-ROM cell by connecting a wiring of the OTP-ROM cell. FIGS. 4 and 5 are cross sectional views of the OTP-ROM cells 22a and 22b. In reference to FIG. 4, in a p-type silicon semiconductor substrate (or a p-type domain of a semiconductor substrate) 30, an STI oxide film 32 for separating elements and n-type domains 34a and 34b of either a source region or a drain region are formed. Between the n-type domains 34a and 34b is a channel. On the channel, a gate electrode 38 is formed via an oxide film 36. On the semiconductor substrate 30 and the gate electrode 38, an interlayer insulating film 40 composed of an oxide silicon film is formed. In the interlayer insulating film 40, a plug electrode 42 reaching to the n-type domains 34a and 34b is formed. To the plug electrode 42, a wiring 44 composed of tungsten is connected. A wiring 44a connected to the n-type domain 34a is separated from a wiring 44b in an area 45. On the interlayer insulating film 40, a protective film 46 composed of oxide silicon is formed.

In reference to FIG. 5, in the areas 45 of all the OTP-ROM cells 22 of all semiconductor chips 12, an opening 50 which runs through the protective film 46 is formed. Forming the opening 50 can be easily made by ordinary processes using a photo-exposure technology with a mask and an etching technology.

Figure 6:
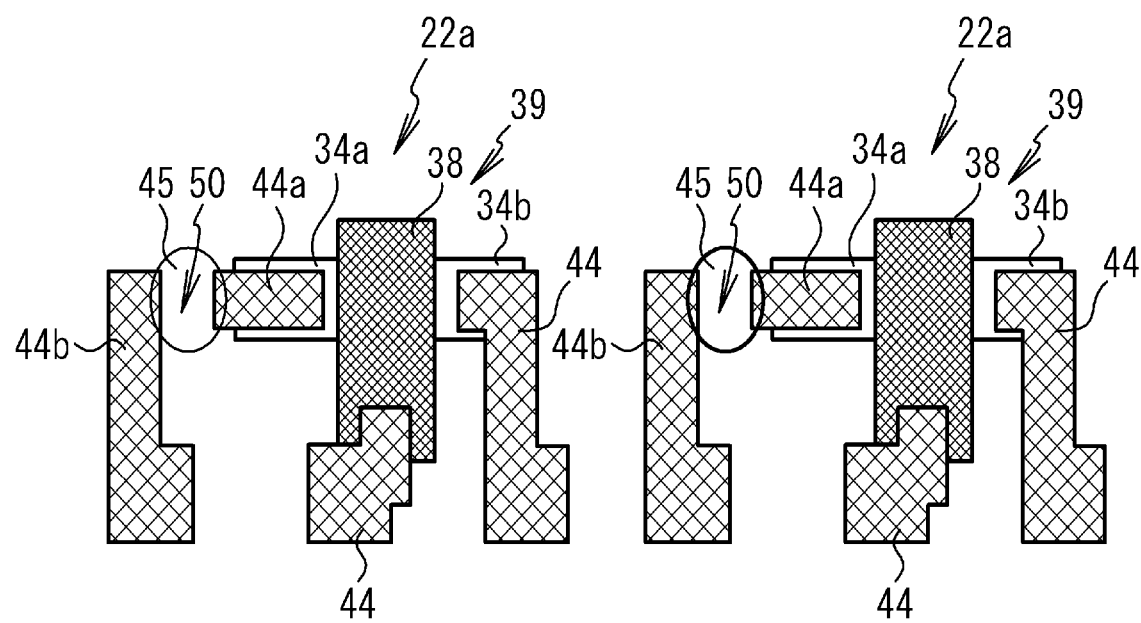
FIG. 6 is a plan view (part 1) of the semiconductor device of the second embodiment to illustrate the manufacturing process.

FIG. 6 is a plan view of the OTP-ROM cell. The gate electrode 38 and the n-type domain 34b of an FET 39 which composes the OTP-ROM cell 22 are respectively connected to the wiring 44. On the contrary, while the n-type domain 34a is connected to the wiring 44a, the n-type domain 34a is separated from the wiring 44b in the area 45. In the area 45, the opening 50 is provided. As descried above, as the wirings 44a and 44b are separated, the FET 39 does not function. In other words, the OTP-ROM cells 22a and 22b are inactivated.

Figure 7:
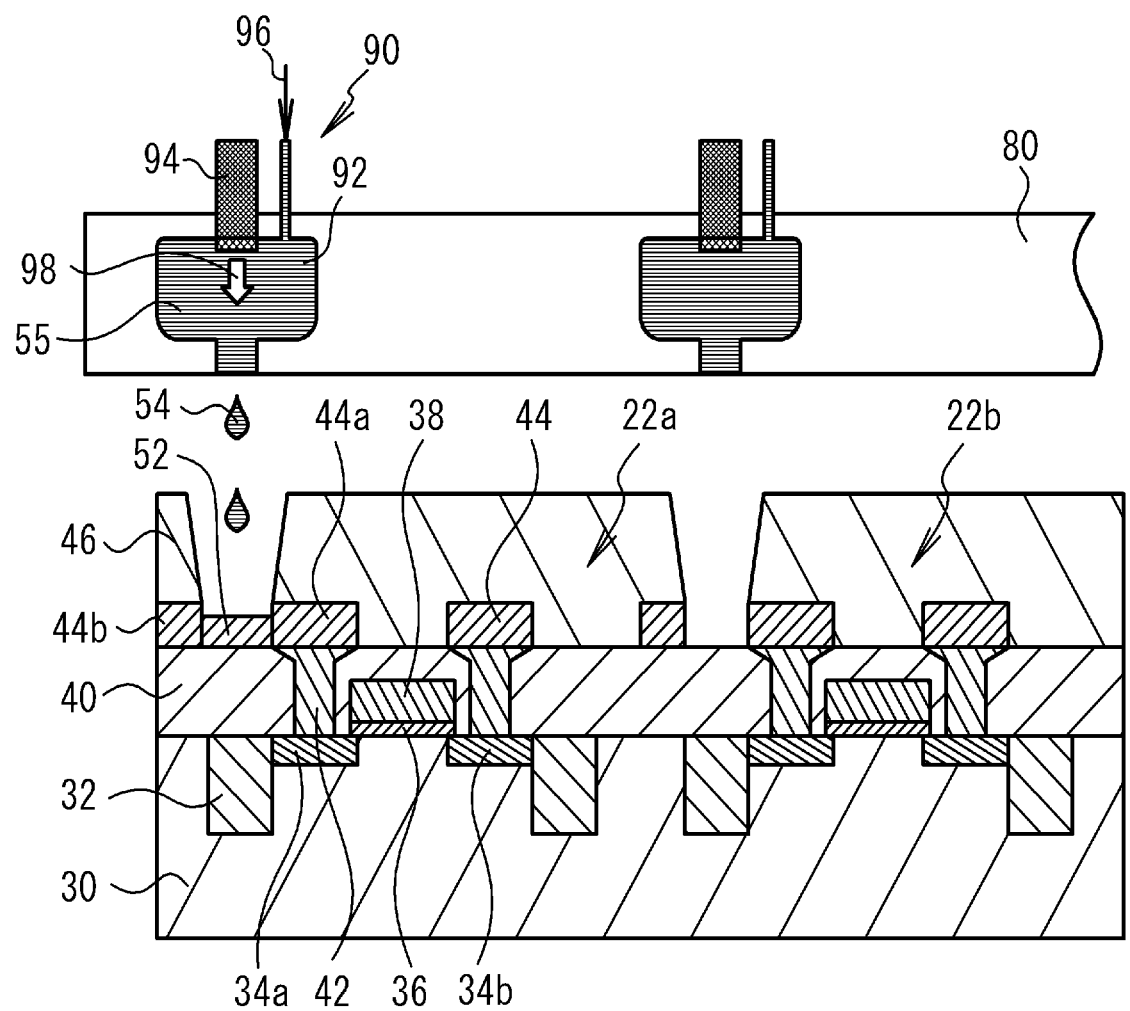
FIG. 7 is a pattern diagram of a program head being positioned over an OTP-ROM cell according to the second embodiment.

In reference to FIG. 7, the program head 80 is positioned over the OTP-ROM cell. The program dot 90 of the program head 80 has a fluid reservoir 92 and a piezoelectric element 94. Into the fluid reservoir 92, a chemical fluid 55 which contains molten metal is supplied from an inlet 96. By the piezoelectric element 94, when a pressure is applied to the chemical fluid 55 in the fluid reservoir 92 in an arrow 98 direction, the chemical fluid 55 is pushed out from an outlet 93 and poured as a droplet 54 into the opening 50. For example, the diameter of the outlet 93 is set as 1 μm and that of the opening 50 is set as 3 μm. In this case, the program dot 90 corresponding to the OTP-ROM cell 22a ejects the chemical fluid 55 and the program dot 90 corresponding to the OTP-ROM cell 22b does not eject the chemical fluid 55. Consequently, the chemical 52 is poured into the opening 50 of the OTP-ROM cell 22a and, in the opening 50 of the OTP-ROM cell 22a, the chemical 52 is not poured. The chemical 52 is a fluid of metal, such as Au, Ag and W, which are mixed with an organic solvent.

Figure 8:
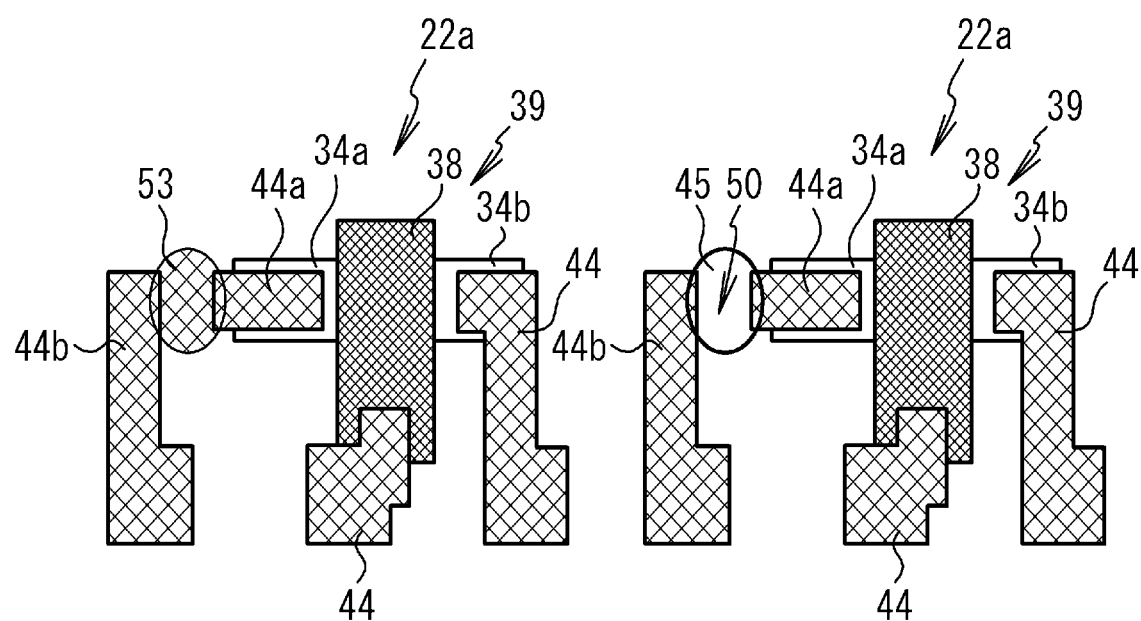
FIG. 8 is a plan view (part 2) of the semiconductor device of the second embodiment to illustrate the manufacturing process.

In reference to FIG. 8, after pouring the chemical 52 into the opening 50, a heat process at about 300 degrees Celsius is taken place to let the solvent in the chemical 52 evaporate. Therefore, the metal remains and the wirings 44a and 44b are connected by a metal 53. Consequently, the OTP-ROM cell 22a is activated, which is regarded as 1, for example. Meanwhile, the OTP-ROM cell 22b remains inactive, which is regarded as 0, for example. As described above, each OTP-ROM cell 22 of the ROM section 20 can be activated or inactivated. Consequently, the ROM section 20 can be programmed with identification information of the semiconductor chip 12.

Third Embodiment

Figure 9:
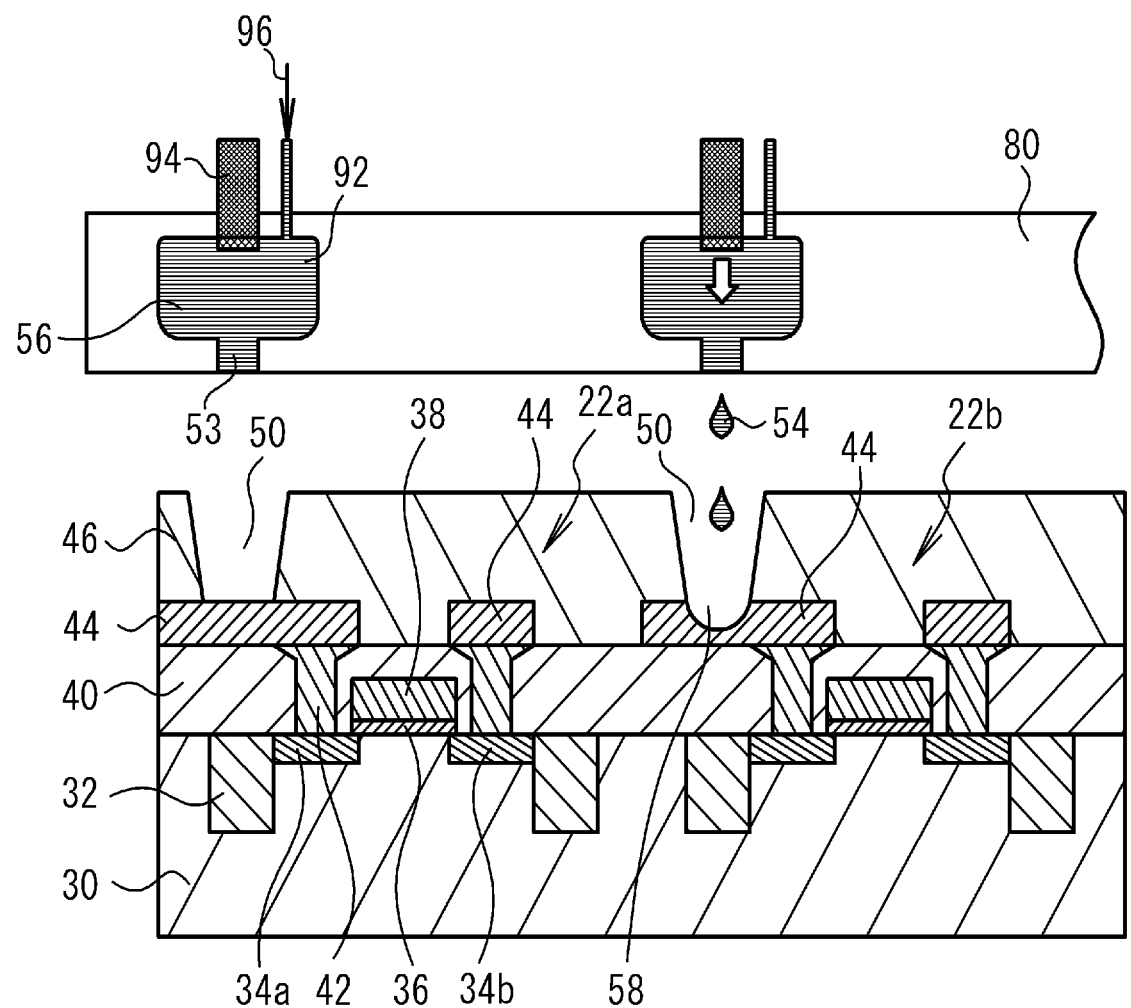
FIG. 9 is a pattern diagram of a program head being positioned over an OTP-ROM cell according to a third embodiment.

A third embodiment of the present invention is an example of programming an OTP-ROM cell by disconnecting a wiring of the OTP-ROM cell. In reference to FIG. 9, in the third embodiment, as the wiring 44 connected to the n-type domain 34a is not separated, the FET of the OTP-ROM cell 22 functions. In other words, the OTP-ROM cell 22 is being activated. In the third embodiment, in the opening 50 of the OTP-ROM cell 22, a chemical 56 in the fluid reservoir 92 is poured as the droplet 54. The chemical 56 is a fluid for etching the wiring 44 and is, for example, a 30% hydrogen peroxide solution. A semiconductor wafer 10 is subjected, for example, to heat to between 80 and 90 degrees Celsius, as an area 58 shown in FIG. 9, tungsten which is the wiring is etched. Thereafter the wiring 44 is disconnected, with a halogen lamp and the like, the chemical 56 is evaporated. Consequently, the OTP-ROM cell 22a remains active and the OTP-ROM cell 22b becomes inactive.

As described in the second embodiment and the third embodiment, when programming the OTP-ROM cell 22, a chemical fluid which activates or inactivates the OTP-ROM cell 22 is ejected to the OTP-ROM cell 22. For activating or inactivating the OTP-ROM cell 22 in the manner described above, by employing a chemical ejecting structure such as the piezoelectric element 94 or a bubble-jet (registered trademark), the program head 80 configured to eject a chemical fluid can be used. Consequently, different identification information for each semiconductor chip 12 can easily be programmed.

Fourth Embodiment

Figure 10:
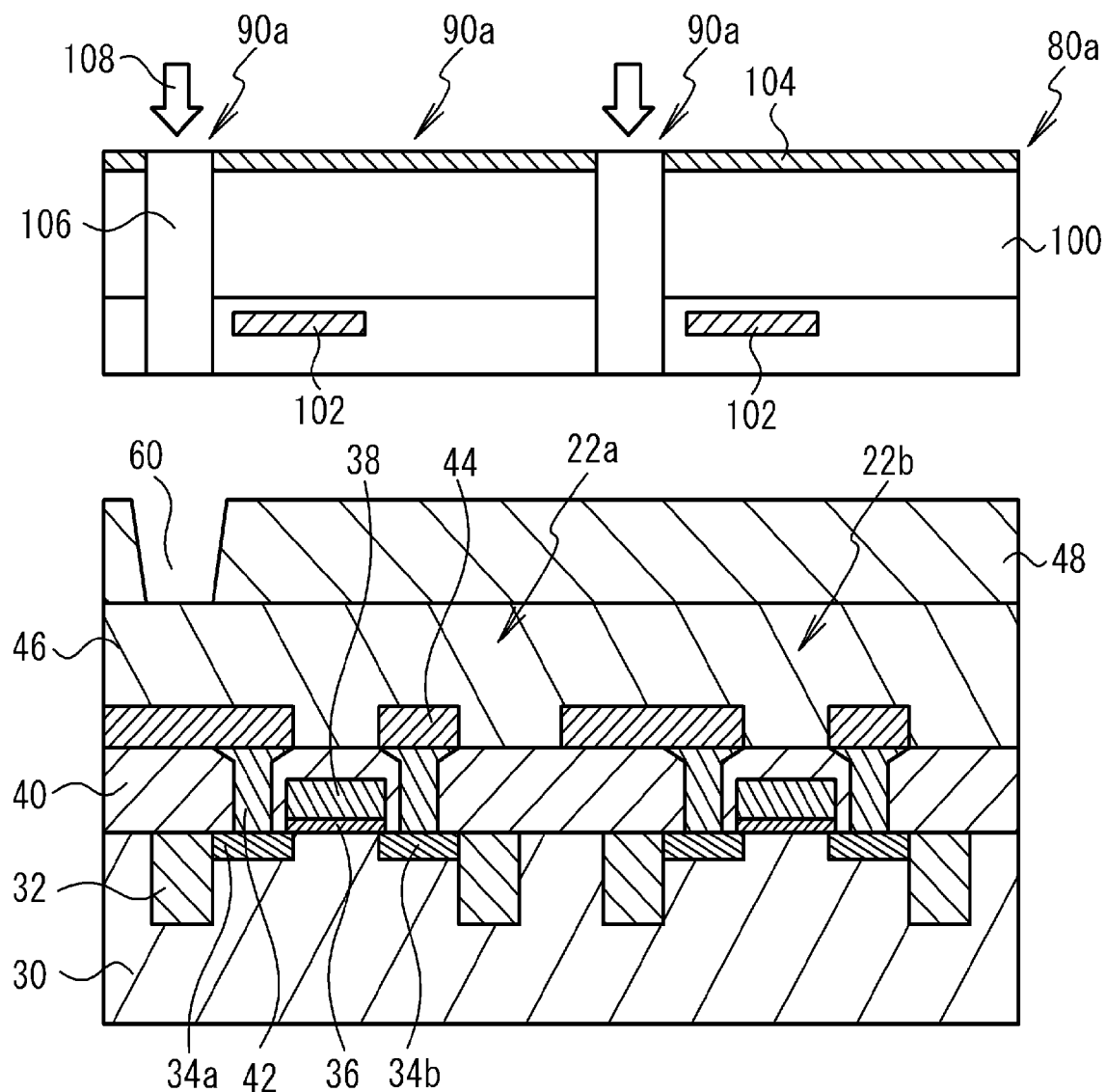
FIG. 10 is a pattern diagram of a program head being positioned over an OTP-ROM cell according to a fourth embodiment.

A fourth embodiment of the present invention is an example of a program head 80a having a movable light blocking plate. In reference to FIG. 10, in the same manner as the third embodiment, the wiring 44 connected to the n-type domain 34a is not separated. A photoresist 48 is applied on the protective film 46. In the program head 80a, on a reticle 100, a light blocking layer 104 is formed. As a program dot 90a, the light blocking layer 104 and the reticle 100 have an opening 106. The opening 106 is light blocked or opened by a movable light blocking plate 102. In FIG. 10, the movable light blocking plate 102 of the program dot 90a corresponding to the OTP-ROM cell 22a is opened and the movable light blocking plate 102 of the program dot 90a corresponding to the OTP-ROM cell 22b is light blocked. Under this condition, by irradiating with an ultraviolet 108, the photoresist 48 on the OTP-ROM cell 22a is photo-exposed. Thereafter the development, an opening 60 is formed in the photoresist 48.

Figure 11:
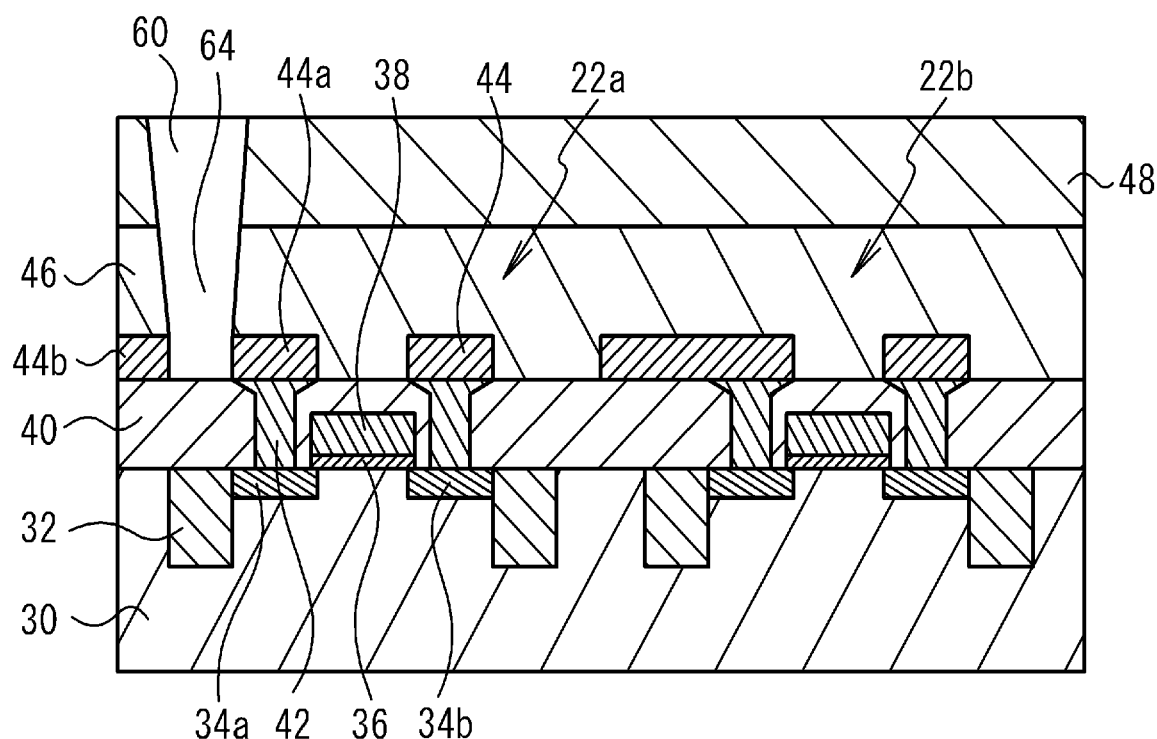
FIG. 11 is a cross sectional view (part 1) of the OTP-ROM cell of the fourth embodiment to illustrate the process of activating or inactivating the OTP-ROM cell.

In reference to FIG. 11, by etching the protective film 46 and the wiring 44 underneath the opening 60 using the photoresist 48 as a mask, the OTP-ROM cell 22a can be inactivated.

Figure 12:
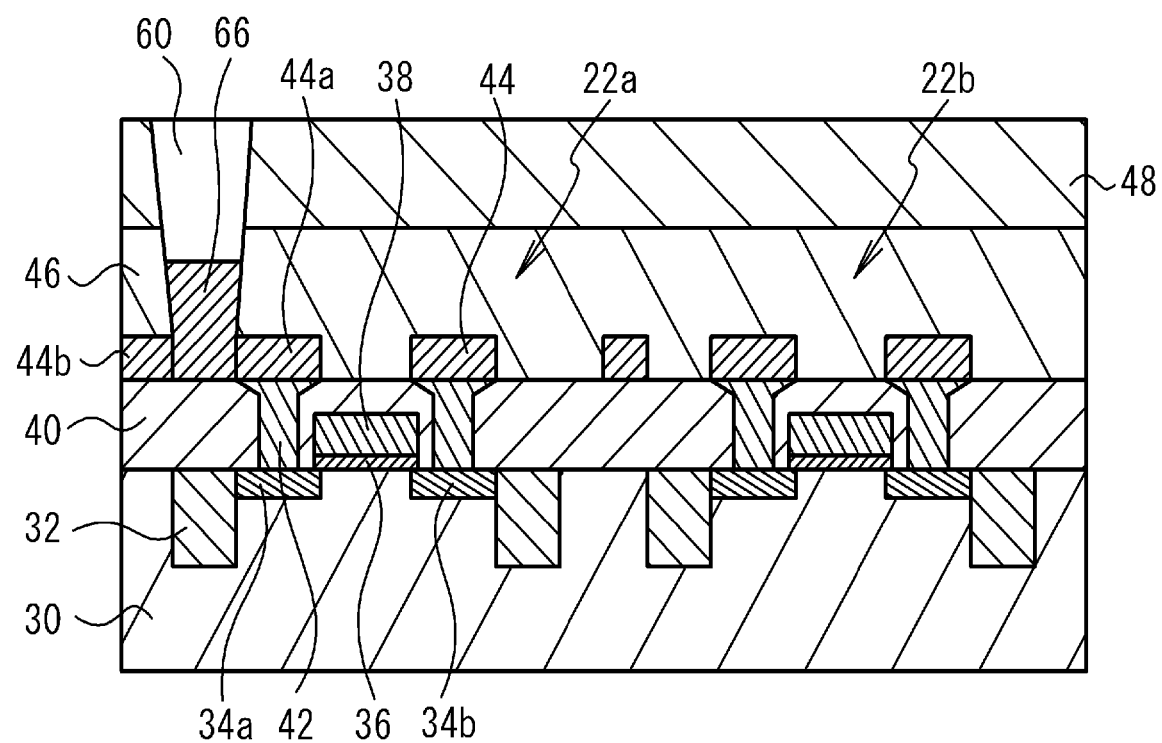
FIG. 12 is a cross sectional view (part 2) of the OTP-ROM cell of the fourth embodiment to illustrate the process of activating or inactivating the OTP-ROM cell.

In reference to FIG. 12, when the wiring 44 of the OTP-ROM cell 22 is separated in the area 45, the protective film 46 underneath the opening 60 is etched using the photoresist 48 as a mask and, a metal 66 is formed using, for example, a plating method, so as to have the wirings 44a and 44b connected. Consequently, the OTP-ROM cell 22a can be activated.

Figure 13:
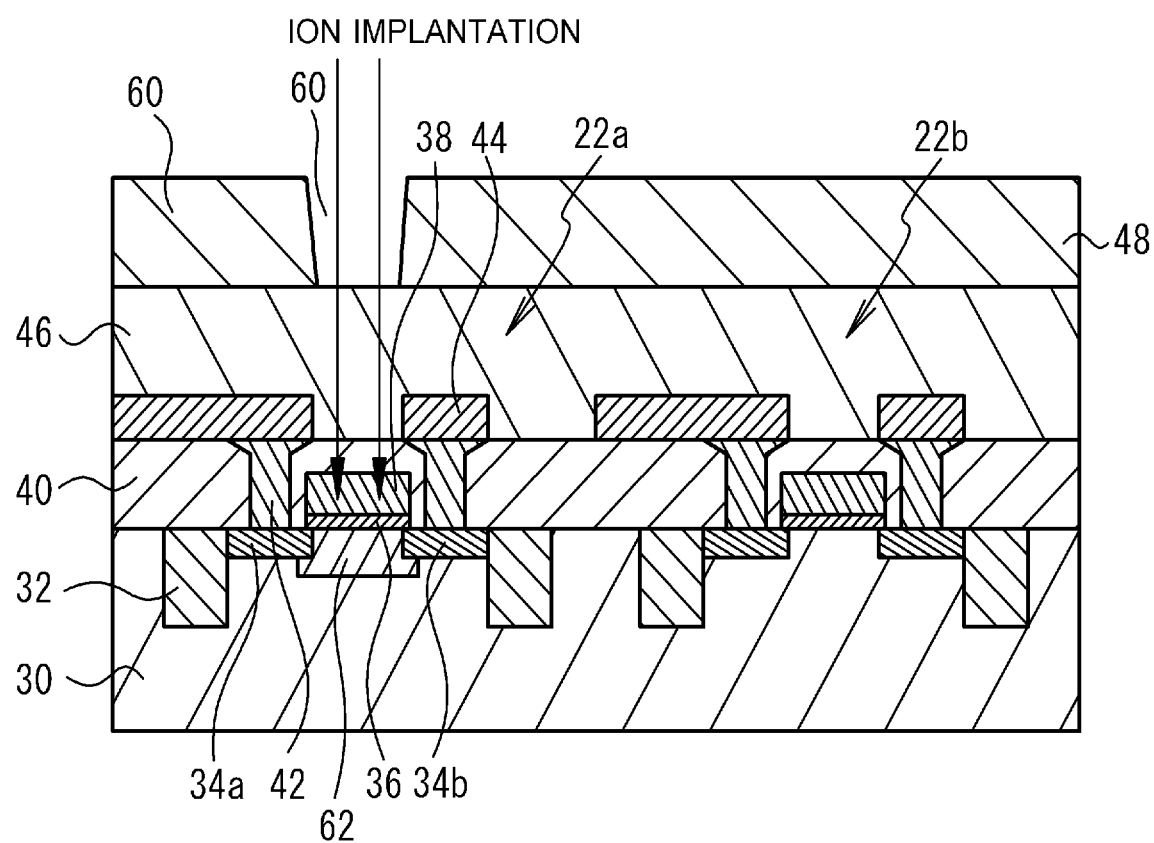
FIG. 13 is a cross sectional view (part 3) of the OTP-ROM cell of the fourth embodiment to illustrate the process of activating or inactivating the OTP-ROM cell.

In reference to FIG. 13, the opening 60 is formed above the gate electrode 38. Using the photoresist 48 as a mask, for example, boron (B) is ion-implanted to the semiconductor substrate 30 where a channel to be formed at an energy level of 1 MeV. Therefore, a highly doped p-type domain 62 is formed in the semiconductor substrate 30. Consequently, the OTP-ROM cell 22a can be inactivated.

Fifth Embodiment

A fifth embodiment of the present invention is an instance of a program head 80b having a fiber. In reference to FIG. 14, the program head 80b is composed of a support 110 of a light blocking characteristic provided with a glass fiber 112 as a program dot. A plurality of glass fibers 112 is selectively irradiated with the laser beam 118. The laser beam 118 is a laser beam having a wavelength of photo-exposing the photoresist 48 and, for example, a laser beam of a KrF excimer laser may be used. The laser beam 118 irradiated to the glass fiber 112 irradiates the photoresist 48. Therefore, the photoresist 48 on the OTP-ROM cell 22 can be selectively photo-exposed. Consequently, in the photoresist 48 on the OTP-ROM cell 22, the opening 60 can be selectively formed. Thereafter, with the same processes as those in the fourth embodiment, the OTP-ROM cell 22a can be inactivated.

Figure 14:
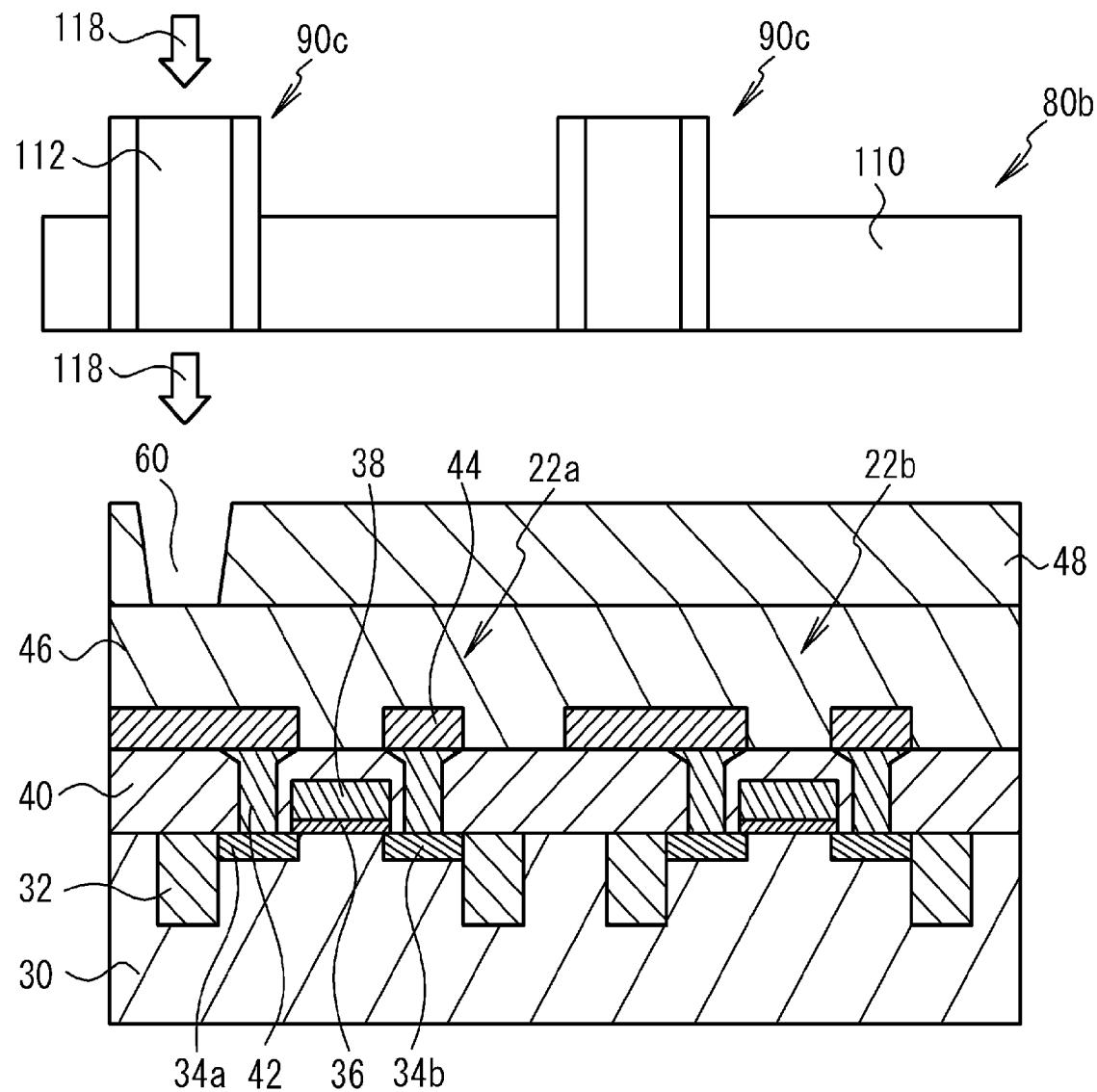
FIG. 14 is a pattern diagram of a program head being positioned over an OTP-ROM cell according to a fifth embodiment.

In accordance with the fourth embodiment and fifth embodiment, as shown in FIGS. 10 and 14, using the program head 80a or 80b, by irradiating the photoresist 48 on the OTP-ROM cell 22 with light, a pattern to activate or inactivate the OTP-ROM cell 22 is formed. Thereafter, as shown in FIGS. 11, 12 and 13, using the pattern of the photoresist 48, the OTP-ROM cell 22 is activated or inactivated. As described above, the OTP-ROM cell 22 can be activated or inactivated.

The activation or inactivation of the OTP-ROM cell 22 can be made, as shown in FIG. 11, by disconnecting the wiring 44 of the OTP-ROM cell 22 or, as shown in FIG. 12, by connecting the wiring 44. Further, as shown in FIG. 13, by ion-implanting the OTP-ROM cell 22, the OTP-ROM cell 22 can be activated or inactivated.

While the preferred embodiments of the present invention is described in details above, the present invention is not limited to those specific embodiments, and within the spirit and scope of the present invention described in claims, various modifications and alterations can be made.

We claim:

1. A method for manufacturing a semiconductor device comprising steps of:
aligning a program head, having a program dot array corresponding to each OTP-ROM cell array provided in areas to be a plurality of semiconductor chips arranged in a semiconductor wafer, to the OTP-ROM cell array in one of the areas to be the plurality of semiconductor chips; and
programming the OTP-ROM cell array with a different pattern for each of the areas to be the plurality of semiconductor chips by using the program head wherein respective different patterns are programmed for each of the plurality of semiconductor chips using respective different configurations of dots associated with the program head.

2. The method for manufacturing a semiconductor device according to claim 1, wherein the step of programming the OTP-ROM cell array ejects a chemical fluid that activates or inactivates a plurality of OTP-ROM cells included in the OTP-ROM cell array to the plurality of OTP-ROM cells.

3. The method for manufacturing a semiconductor device according to claim 2, wherein the step of programming the OTP-ROM cell array activates or inactivates the plurality of OTP-ROM cells by connecting a wiring of the OTP-ROM cell array by using the chemical fluid.

4. The method for manufacturing a semiconductor device according to claim 2, wherein the step of programming the OTP-ROM cell array activates or inactivates the plurality of OTP-ROM cells by disconnecting a wiring of the OTP-ROM cell array by using the chemical fluid.

5. The method for manufacturing a semiconductor device according to claim 1, wherein the step of programming the OTP-ROM cell array comprises:
forming a pattern to activate or inactivate a plurality of OTP-ROM cells by irradiating a photoresist on the OTP-ROM cell array with light by using the program head; and
activating or inactivating the plurality of OTP-ROM cells by connecting or disconnecting a wiring of the OTP-ROM cell array by using the pattern.

6. The method for manufacturing a semiconductor device according to claim 1, wherein the step of programming the OTP-ROM cell array comprises:
forming a pattern to activate or inactivate a plurality of OTP-ROM cells by irradiating a photoresist on the OTP-ROM cell array with light by using the program head; and
activating or inactivating the plurality of OTP-ROM cells by ion-implanting the plurality of OTP-ROM cells by using the pattern.

7. A semiconductor manufacturing device comprising:
a program head having a program dot array corresponding to each OTP-ROM cell array provided in areas to be a plurality of semiconductor chips arranged in a semiconductor wafer; and
an aligning portion for aligning the program head to the OTP-ROM cell array in one of the areas to be the plurality of semiconductor chips;
wherein the program head programs the OTP-ROM cell array with a different pattern for each of the areas to be the plurality of semiconductor chips wherein respective different patterns are programmed for each of the plurality of semiconductor chips using respective different configurations of dots associated with the program head.

* * * * *